United States Patent
Kim et al.

(10) Patent No.: US 9,991,877 B2
(45) Date of Patent: Jun. 5, 2018

(54) CURRENT BREAK CIRCUIT, SEMICONDUCTOR DEVICE HAVING THE SAME AND OPERATING METHOD THEREOF

(71) Applicant: SK hynix Inc., Gyeonggi-do (KR)

(72) Inventors: Min Su Kim, Busan (KR); Kang Youl Lee, Daejeon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/373,738

(22) Filed: Dec. 9, 2016

(65) Prior Publication Data
US 2018/0041197 A1  Feb. 8, 2018

(30) Foreign Application Priority Data
Aug. 5, 2016 (KR) .......... 10-2016-0100203

(51) Int. Cl.
*H03K 3/00* (2006.01)
*H03K 3/012* (2006.01)
*H03K 17/16* (2006.01)
*H03K 17/28* (2006.01)

(52) U.S. Cl.
CPC ............ *H03K 3/012* (2013.01); *H03K 17/16* (2013.01); *H03K 17/28* (2013.01)

(58) Field of Classification Search
CPC ..................................... H03K 3/012
See application file for complete search history.

(56) References Cited

U.S. PATENT DOCUMENTS

2009/0003114 A1* 1/2009 Priel .................. H03K 19/0016
  365/227
2013/0285711 A1   10/2013 Miyake

FOREIGN PATENT DOCUMENTS

KR   1020120136614   12/2012

* cited by examiner

*Primary Examiner* — Daniel Puentes
(74) *Attorney, Agent, or Firm* — IP & T Group LLP (57) ABSTRACT

A current break circuit includes a current break control circuit suitable for sequentially outputting a first enable signal and a second enable signal with a time difference in response to at least one control signal, and a current break switch circuit suitable for outputting or blocking a second voltage in response to a first voltage, wherein the current break switch circuit forms a first current path in response to the first enable signal and a second current path in response to the second enable signal when blocking the second voltage.

20 Claims, 6 Drawing Sheets

CURRENT BREAK CIRCUIT, SEMICONDUCTOR DEVICE HAVING THE SAME AND OPERATING METHOD THEREOF

CROSS-REFERENCE TO RELATED APPLICATION

The present application claims priority under 35 U.S.C. § 119(a) to Korean patent application number 10-2016-0100203, filed on Aug. 5, 2016, the entire disclosure of which is incorporated herein by reference in its entirety.

BACKGROUND

Field of Invention

Various embodiments of the invention relate generally to a semiconductor device and, more particularly, to a current break circuit for a semiconductor device, the semiconductor device having the current break circuit, and an operating method thereof.

Description of Related Art

Substantial developments in electronic devices require smaller, higher performance, and more functional semiconductor devices. However, development of smaller semiconductor devices that can perform more functions may be limited by power consumption and heat dissipation concerns which need to be addressed. Particularly, in the development of various types of electronic devices and systems where batteries are used to provide the required power, power consumption of the semiconductor device may be a limiting factor. It has been proposed that to reduce the power which is wasted as heat from a semiconductor device and to increase the operation time of the semiconductor device based on a limited power supply, it is important to reduce unnecessary power consumption in a standby mode. Some have proposed including a power gating circuit in a semiconductor device for preventing power supply to the various function blocks in the standby mode. However, further improvements are needed.

SUMMARY

Various embodiments are directed to an improved power break circuit for a semiconductor device, a semiconductor device including the power break circuit and an operating method thereof. The power break circuit may block power supply to an internal circuit included in the semiconductor device in a standby mode.

According to an embodiment, a current break circuit may include a current break control circuit suitable for sequentially outputting a first enable signal and a second enable signal with a time difference in response to at least one control signal, and a current break switch circuit suitable for outputting or blocking a second voltage in response to a first voltage, wherein the current break switch circuit forms a first current path in response to the first enable signal and a second current path in response to the second enable signal when blocking the second voltage.

According to an embodiment, a semiconductor device may include a power gating circuit suitable for receiving a first voltage, outputting the first voltage as a second voltage in an active mode, and blocking an output of the second voltage by forming a current path with a time difference in a circuit outputting the second voltage in a standby mode, and an internal circuit suitable for operating at the second voltage as power in the active mode.

According to an embodiment, a method of operating a current break circuit may include coupling first current break units to a ground terminal, among the first current break units and second break units receiving a first voltage and outputting a second voltage, when an active mode is switched to a standby mode, coupling the second current break units to the ground terminal, and blocking an output of the second voltage.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Hereinafter, various exemplary embodiments will be described in detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

In the drawings, dimensions of various parts or components may be exaggerated for convenience of illustration. In the following description, a detailed explanation of related well known functions and constitutions may be omitted for simplicity and conciseness.

It is also noted that in this specification, "connected/coupled" refers to one component not only directly coupling another component but also indirectly coupling another component through an intermediate component.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings. Like reference numerals refer to like elements throughout the specification and drawings.

Figure 1:
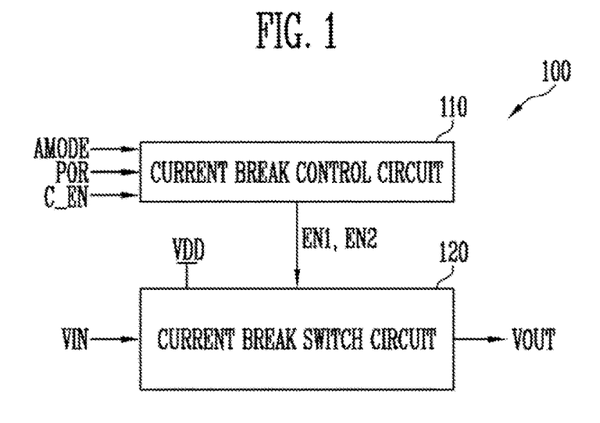
FIG. 1 is a diagram illustrating a current break circuit including a current break switch circuit and a current break control circuit, according to an embodiment of the present invention.

Referring now to FIG. 1 a current break circuit 100 is provided, according to an embodiment of the present invention.

Referring to FIG. 1, the current break circuit 100 may receive a first voltage VIN and selectively output the first voltage VIN as a second voltage VOUT in response to control signals AMODE, POR and C_EN. For example, the current break circuit 100 may output or block the second voltage VOUT in response to the control signals AMODE, POR and C_EN. When the current break circuit 100 blocks the output of the second voltage VOUT, the current break circuit 100 may block the output of the second voltage VOUT by doubly blocking a current path in the current break circuit 100. The current break circuit 100 may include a current break control circuit 110 and a current break switch circuit 120 operatively coupled to one another. The current break control circuit 110 may control the operation of the current break switch circuit 120.

For example, the current break control circuit 110 may selectively output first and second enable signals EN1 and EN2 in response to the control signals AMODE, POR and C_EN. For example, the current break control circuit 110 may output the first enable signal EN1 and then the second enable signal EN2 after a predetermined time delay.

The current break switch circuit 120 may receive the first voltage VIN and output the first voltage VIN as the second voltage VOUT, or block the first voltage VIN in response to the first and second enable signals EN1 and EN2. A power source terminal of the current break switch circuit 120 is denoted by 'VDD.' The first voltage VIN may be an externally transferred voltage. The second voltage VOUT may be supplied to one or more circuits forming the semiconductor device including the current break circuit 100.

The respective circuits of the current break circuit 100 are described below in more detail.

Figure 2:
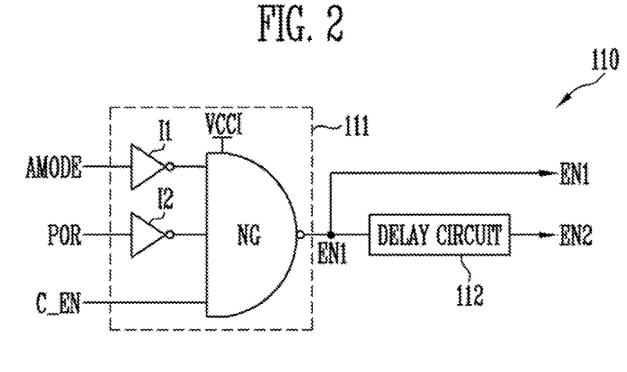
FIG. 2 is a circuit diagram illustrating an exemplary configuration of the current break circuit shown in FIG. 1, according to an embodiment of the present invention.

FIG. 2 is a circuit diagram illustrating an exemplary configuration of the current break control circuit 110 shown in FIG. 1, according to an embodiment of the present invention.

Referring to FIG. 2, the current break control circuit 110 may output the first and second enable signals EN1 and EN2 in response to the control signals AMODE, POR and C_EN. After the current break control circuit 110 outputs the first enable signal EN1, the current break control circuit 110 may output the second enable signal EN2 after a predetermined time delay. The current break control circuit 110 may include a first enable signal output circuit 111 and a delay circuit 112.

The first enable signal output circuit 111 may output the first enable signal EN1 in response to the control signals AMODE, POR and C_EN. The delay circuit 112 may output the second enable signal EN2 after a predetermined time delay in response to the first enable signal EN1. The respective circuits are described below in more detail.

The first enable signal output circuit 111 may include a NAND gate NG which outputs the first enable signal EN1 in response to the control signals AMODE, POR and C_EN. A power source terminal of the first enable signal output circuit 111 is denoted by 'VCCI.' In addition, the first enable signal output circuit 111 may include inverters I1 and I2 for inverting the control signals AMODE and POR.

The control signals AMODE, POR and C_EN may be an active mode signal AMODE, a power on reset signal POR and a chip enable signal C_EN, respectively. The active mode signal AMODE may be applied to activate the current break circuit 100. For example, when the current break circuit 100 is activated, the active mode signal AMODE may be at a high level, and when the current break circuit 100 is deactivated, the active mode signal AMODE may transition to a low level. The power on reset signal POR may rise from low level to high level when power is increased. After the power reaches a desired level, the power on reset signal POR may transition from high level to low level. The chip enable signal C_EN may be at a high level when a circuit to which the second voltage VOUT is applied is selected.

Since the NAND gate NG outputs a low signal when all input signals are at a high level, the first inverter I1 may invert the active mode signal AMODE and supply the inverted active mode signal to the NAND gate NG. The second inverter I2 may invert the power on reset signal POR and supply the inverted power on reset signal to the NAND gate NG. As described above, when the current break circuit 100 is activated, the first and second enable signals EN1 and EN2 may be outputted at a high level, and the current break switch circuit 120 may block the output of the second voltage VOUT in response to the first and second enable signals EN1 and EN2. The NAND gate NG of the current break control circuit 110 may output the first enable signal EN1 having a high level so that the first and second enable signals EN1 and EN2 may be outputted at a high level.

At least one of the signals input to the NAND gate NG may be at a low level so that the first enable signal EN1 may be output at a high level. Thus, the first and second inverters I1 and I2 may be used to invert the active mode signal AMODE and the power on reset signal POR, respectively and apply the respectively inverted signals to the NAND gate NG of the current break control circuit 110. For example, the first inverter I1 may invert the active mode signal AMODE and transmit the inverted active mode signal to the NAND gate NG, while the second inverter I2 may invert the power on reset signal POR and transmit the inverted power on reset signal to the NAND gate NG. Therefore, the current break control circuit 110 may output the first enable signal EN1 at a high level when the active mode signal AMODE has a high level, regardless of the power on reset signal POR and the chip enable signal C_EN.

When the first enable signal EN1 at the high level is fed into the delay circuit 112, the delay circuit 112 may output the second enable signal EN2 at a high level after a predetermined time delay. Hence, the delay circuit 112 may receive the first enable signal EN1 and output the second enable signal EN2 having the same logic signal as the first enable signal EN1 with a time delay. The delay circuit 112 may be composed of various types of time delay circuits. For example, the delay circuit 112 may include one or more inverters coupled in series. The time delay may be controlled by the number of inverters. Therefore, the number of inverters constituting the delay circuit 112 may be determined in consideration of time when a glitch occurs in a node where the second voltage VOUT as shown in FIG. 1 is output.

Figure 3:
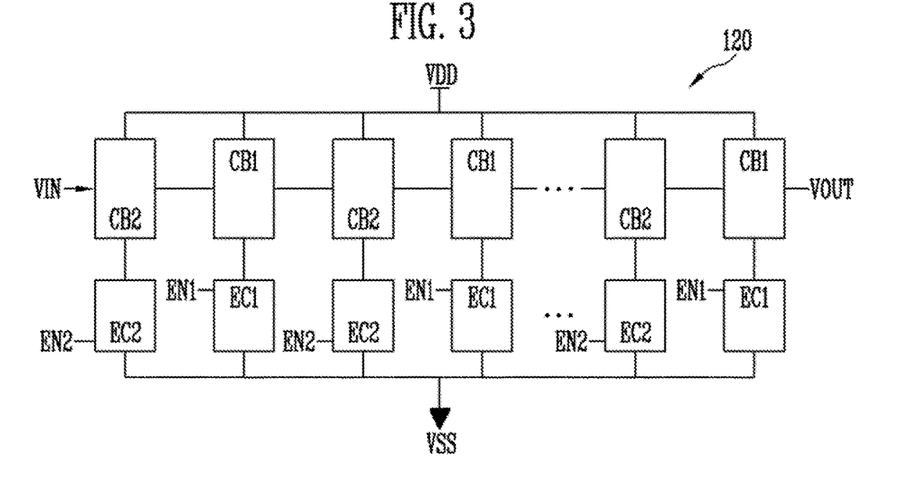
FIG. 3 is a block diagram illustrating an exemplary configuration of the current break switch circuit shown in FIG. 1, according to an embodiment.

FIG. 3 is a block diagram illustrating the current break switch circuit 120 shown in FIG. 1 in detail, according to an embodiment of the present invention.

Referring to FIG. 3, the current break switch circuit 120 may selectively form a current path in response to the first and second enable signals EN1 and EN2 to output or block the first voltage VIN as the second voltage VOUT. For example, the current break switch circuit 120 may include a plurality of current break units CB1 and CB2 and a plurality of enable units EC1 and EC2 coupled between a power source terminal VDD and a ground terminal VSS. Each of the current break units CB1 and each of the enable units EC1 may form a pair. Also, each of the current break units CB2 and each of the enable units EC2 may form a pair. Each pair of current break units CB1 and the enable units EC1 may be coupled in series between the power source terminal VDD and the ground terminal VSS. Also, each pair of the current break units CB2 and the enable units EC2 may be coupled in series between the power source terminal VDD and the ground terminal VSS.

The current break units CB1 and CB2 may include first current break units CB1 and second current break units CB2, and the enable units EC1 and EC2 may include first enable units EC1 and second enable units EC2. The first current break units CB1 and the first enable units EC1 may form pairs, and the second current break units CB2 and the second enable units EC2 may form pairs. The first and second current break units CB1 and CB2 may be alternately arranged and coupled in series, and the first and second enable units EC1 and EC2 may be alternately arranged and coupled in series with each other. In other words, the first current break units CB1 may be arranged between the second current break units CB2, and the first enable units EC1 may be arranged between the second enable units EC2.

The first and second current break units CB1 and CB2 may be coupled to the power source terminal VDD, and the first and second enable units EC1 and EC2 may be coupled to the ground terminal VSS. The first current break units CB1 and the first enable units EC1 may form or block a current path between the power source terminal VDD and the ground terminal VSS in response to the first enable signal EN1. The second current break units CB2 and the second enable units EC2 may form or block a current path between the power source terminal VDD and the ground terminal VSS in response to the second enable signal EN2.

The first voltage VIN may be applied to the foremost current break unit among the first and second current break units CB1 and CB2, and the second voltage VOUT may be output from the last current break unit among the first and second current break units CB1 and CB2. The first voltage VIN may be a positive voltage greater than 0V. When the second current break units CB2 are odd-numbered and the first current break units CB1 are even-numbered, the first voltage VIN may be applied to the foremost second current break unit CB2. When the second enable unit EC2 forming a pair with the foremost second current break unit CB2 is deactivated, the foremost second current break unit CB2 may supply a voltage to the foremost first current break unit CB1 among the first current break units CB1. When the second enable unit EC2 forming a pair with the foremost second current break unit CB2 is activated, a current path may be formed between the first second current break unit CB2 and the first second enable unit EC2, and an input terminal of the foremost first current break unit CB1, among the first current break units CB1, may be discharged. In other words, the level of the input terminal of the first current break unit CB1 may be reduced to 0V. The first enable units EC1 may operate at the same time in response to the first enable signal EN1, and the second enable units EC2 may operate at the same time in response to the second enable signal EN2. The first current break units CB1 and the second current break units CB2 may operate at the same time in response to operations of the first enable units EC1 or the second enable units EC2.

The above-described current break switch circuit 120 is described below in more detail.

Figure 4:
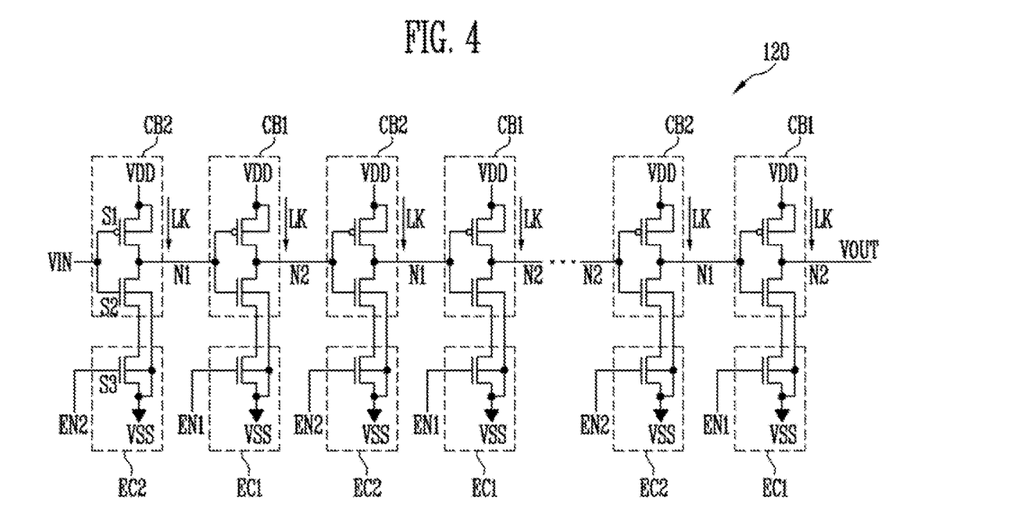
FIG. 4 is a circuit diagram illustrating an exemplary configuration of the current break switch circuit shown in FIG. 1, according to an embodiment of the present invention.

FIG. 4 is a circuit diagram illustrating the current break switch circuit 120 shown in FIG. 1 in detail, according to an embodiment of the present invention.

The connection relationships between the first and second current break units CB1 and CB2 and the first and second enable units EC1 and EC2 are described above with reference to FIG. 3. Therefore, a description thereof will not be repeated in connection with FIG. 4.

Referring to FIG. 4, the first and second current break units CB1 and CB2 may be configured in the same manner as each other, and the first and second enable units EC1 and EC2 may also be configured in the same manner as each other. The second current break unit CB2, which is at the front of the first and second current break units CB1 and CB2, and the second enable unit EC2, which is at the front of the first and second enable units EC1 and EC2, will be described in detail.

The second current break unit CB2 may be configured in the same manner as an inverter. For example, the second current break unit CB2 may include a first switch S1 and a second switch S2 coupled in series between the power source terminal VDD and the second enable unit EC2. The first switch S1 may be a PMOS transistor and the second switch S2 may be an NMOS transistor. Gates of the first and second switches S1 and S2 may be coupled to the same node. A first terminal (i.e., source) of the first switch S1 may be coupled to the power source terminal VDD, and a second terminal (i.e., drain) thereof may be coupled to a first node N1. A first terminal (i.e., drain) of the second switch S2 may be coupled to the first node N1 and a second terminal (i.e., source) thereof may be coupled to the second enable unit EC2. The node to which the gates of the first and second switches S1 and S2 are commonly coupled may be an input terminal of the second current break unit CB2. A node connected between the first and second switches S1 and S2 may be an output terminal of the second current break unit CB2.

Since the first and second current break units CB1 and CB2 configured as described are alternately coupled to each other, the output terminal of the second current break unit CB2 may be an input terminal of the next first current break unit CB1, and an output terminal of the first current break unit CB1 may be an input terminal of the next second current break unit CB2. For example, output terminals of the second current break units CB2 may be the first nodes N1, the first nodes N1 may be input terminals of the first current break units CB1, and output terminals of the first current break units CB1 may be the second nodes N2. Therefore, the first voltage VIN may be applied to the input terminal of the second current break unit CB2 arranged at the front, and the second voltage VOUT may be output through the output terminal of the first current break unit CB1 at the end. Through not shown in FIG. 4, a discharge circuit may be further coupled to the first and second nodes N1 and N2. The discharge circuit (not illustrated) may be used to reset the first and second nodes N1 and N2 to a low level. Therefore, the second voltage VOUT may be output in synchronization with the first voltage VIN.

The second enable unit EC2 may include a third switch S3. The third switch S3 may be an NMOS transistor coupled between the second switch S2 and the ground terminal VSS, and turned on or off in response to the second enable signal EN2. When the second enable signal EN2 is at a high level, the second enable units EC2 may be activated. When the second enable units EC2 are activated, a current path may be formed between sources of the second switches S2 included in the second current break units CB2 and the ground terminal VSS, so that potentials of nodes discharged when the second switches S2 are turned on may be prevented from being increased. In addition, when the first enable signal EN1 is at a high level, the first enable units EC1 may be activated, so that a current path may be formed between sources of the second switches S2 included in the first current break units CB1 and the ground terminal VSS. Therefore, potentials of nodes discharged when the second switches S2 are turned on may be prevented from being increased. By setting a time difference between when the first enable signal EN1 is activated at a high level and when the second enable signal EN2 is activated at a high level, a defect by glitch may be prevented from occurring in the second voltage VOUT caused by leakage LK of the first switches S1.

Operations of the current break circuit 100 are described below with reference to the above-described circuits.

Figure 5:
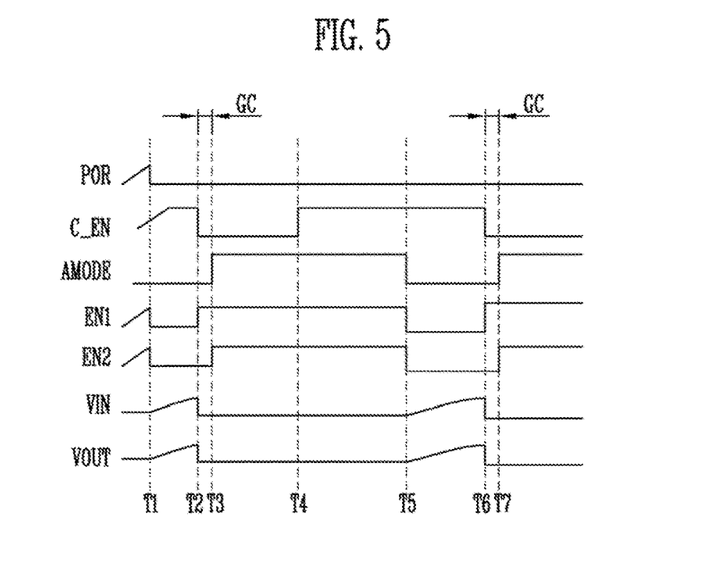
FIG. 5 is a timing diagram illustrating operations of a current break circuit according to an embodiment of the present invention.

FIG. 5 is a timing diagram illustrating operations of the current break circuit 100 of FIG. 1 according to an embodiment of the present invention.

Referring to FIG. 5, during a power on operation (period before T1), the active mode signal AMODE may be deactivated, and levels of the power on reset signal POR, the chip enable signal C_EN and the first and second enable signals EN1 and EN2 may gradually increase.

When the power on operation is completed and the level of the chip enable signal C_EN transitions to a high level (T1), the power on reset signal POR and the first and second enable signals EN1 and EN2 may transition to a low level at the same time, and levels of the first and second voltages VIN and VOUT may be increased gradually. More specifically, when the power on reset signal POR and the active mode signal AMODE are at a low level and the chip enable signal C_EN is at a high level, since high signals are input to all input ends of the NAND gate NG as shown in FIG. 2, both the first enable signal EN1 and the second enable signal EN2 may transition to a low level. In addition, although the first voltage VIN starts to increase earlier than the second voltage VOUT, the second voltage VOUT may also be increased by the current break switch circuit 120 with almost no time difference (T1-T2) between the first voltage VIN and the second voltage VOUT. During the period T1-T2, the level of the chip enable signal C_EN may be further increased, reach a target level and stay at the target level till the end of the period T1-T2.

Before a standby mode starts (at T2), the first voltage VIN may be reduced to 0V, the chip enable signal C_EN may be reduced to 0V, and the first enable signal EN1 may transition from low to high, so that the second voltage VOUT may be reduced to 0V. The second enable signal EN2 may maintain the low level since the second enable signal EN2 is delayed due to a time difference between the first enable signal EN1 and the second enable signal EN2. When the first enable signal EN1 transitions to high first while the second enable signal EN2 is at the low level, only the first enable units EC1 may be activated while the second enable units EC2 are deactivated. As a result, the second nodes N2 may be discharged first. At T3, the second enable signal EN2 and the active mode signal AMODE may be activated at a high level, so that the standby mode may be activated.

The reason the second enable signal EN2 is activated after a delay of a predetermined time (period T2-T3) after the first enable signal EN1 is activated will be described below with reference to FIG. 6.

Figure 6:
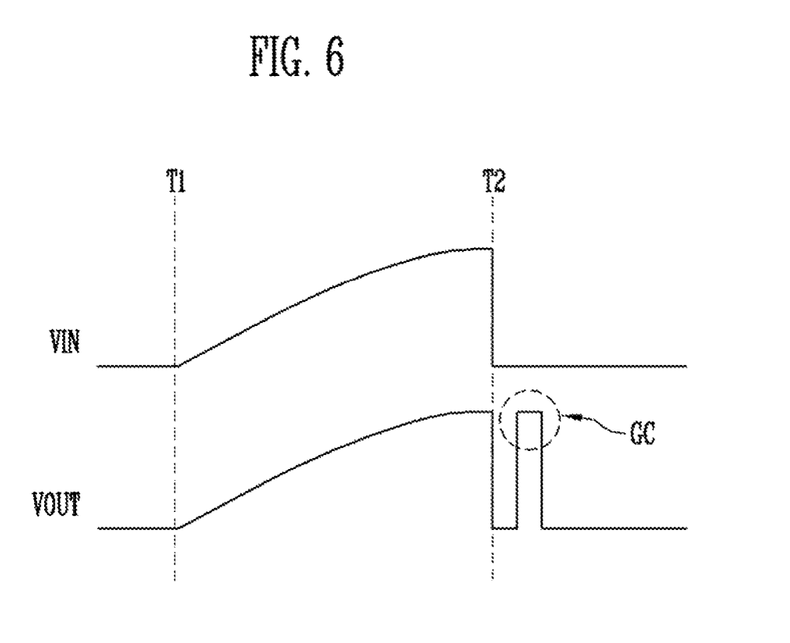
FIG. 6 is a diagram illustrating a glitch which may occur in an output voltage of a current break circuit.

FIG. 6 is a diagram illustrating a glitch which may occur in an output voltage VOUT of the current break circuit 100 of FIG. 1.

FIG. 6 shows a case wherein the first and second enable signals EN1 and EN2 transition to high at the same time. Since the first and second enable units EC1 and EC2 are activated at the same time, a current path may be formed between the first and second current break units CB1 and CB2 and the first and second enable units EC1 and EC2 at the same time. Since current paths are formed between the first and second current break units CB1 and CB2 and the ground terminal VSS at the same time, the leakage LK as shown in FIG. 4 may occur in the first switches S1 and the voltages of the first and second nodes N1 and N2 may be temporarily increased. Therefore, a glitch GC, i.e., a temporary increase in the second voltage VOUT may occur in the period T2-T3.

When the glitch GC occurs, the voltage may temporarily increase to result in increased power consumption in a standby mode where voltage needs to be blocked. To avoid such glitch, the second enable signal EN2 may be activated after a delay of a predetermined time after the first enable signal EN1 is activated as shown in FIG. 5.

Referring again to FIG. 5, the period T2-T3 may be set taking into account when the glitch GC may occur. For example, the time when the glitch GC may occur may be measured during a test operation of the semiconductor device, and the time point T3 may be set based on the measured time so that it is after the measured time at which the glitch GC may occur. Hence, the second enable signal EN2 is activated at the time point T3 which is after the time when the glitch GC may occur. Since the first and second enable signals EN1 and EN2 are both activated only after the time point T3 which is after the point that the glitch GC may occur, the second voltage VOUT may be stably reduced. Thus, the active mode signal AMODE may be activated so that the standby mode may be activated from the time point T3.

When the standby mode is released and switched again to the active mode, a time difference may be made between the first enable signal EN1 and the second enable signal EN2. For example, when the standby mode is terminated and is substantially changed into an active mode, the chip enable signal C_EN may transition from low to high (T4). Subsequently, at a time point T5 where the standby mode is substantially terminated, the active mode signal AMODE and the first and second enable signals EN1 and EN2 may all transition from high to low. Since the active mode starts from the time point T5, the first and second voltages VIN and VOUT may be increased again.

When the active mode is terminated and switched again to the standby mode, a period T6-T7 may be defined in the same manner as the above-described period T2-T3.

As described above, since a voltage (e.g., second voltage VOUT) supplied to the internal circuit included in the semiconductor device is stably blocked in a standby mode, power consumption of the semiconductor device may be reduced.

The mode change of the above-described current break circuit 100 as shown in FIG. 1 allows the current break circuit 100 to be used in various devices where a voltage is repeatedly supplied and blocked. An embodiment thereof will be described below.

Figure 7:
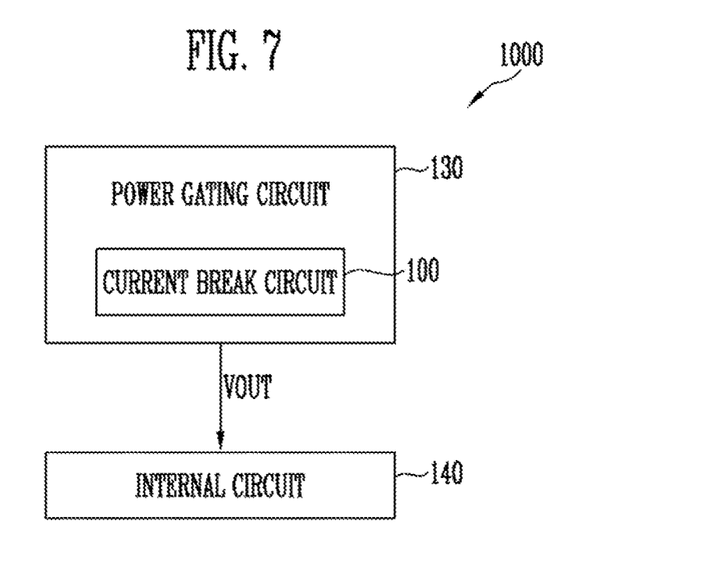
FIG. 7 is a diagram illustrating a semiconductor device according to an embodiment of the present invention.

FIG. 7 is a diagram illustrating a semiconductor device 1000 according to an embodiment of the present invention.

Referring to FIG. 7, the semiconductor device 1000 may include a power gating circuit 130 and an internal circuit 140. The power gating circuit 130 may supply the second voltage VOUT to the internal circuit 140 in an active mode and stop supplying the second voltage VOUT in a standby mode. The power gating circuit 130 may include the above-described current break circuit 100.

The internal circuit 140 may include various types of circuits using the second voltage VOUT as a voltage source. For example, the internal circuit 140 may include a control logic performing various operations.

As described above, when the current break circuit 100 switches from the active mode to the standby mode, the second voltage VOUT supplied to the internal circuit 140 may be blocked without a glitch to prevent unnecessary voltage consumption.

Figure 8:
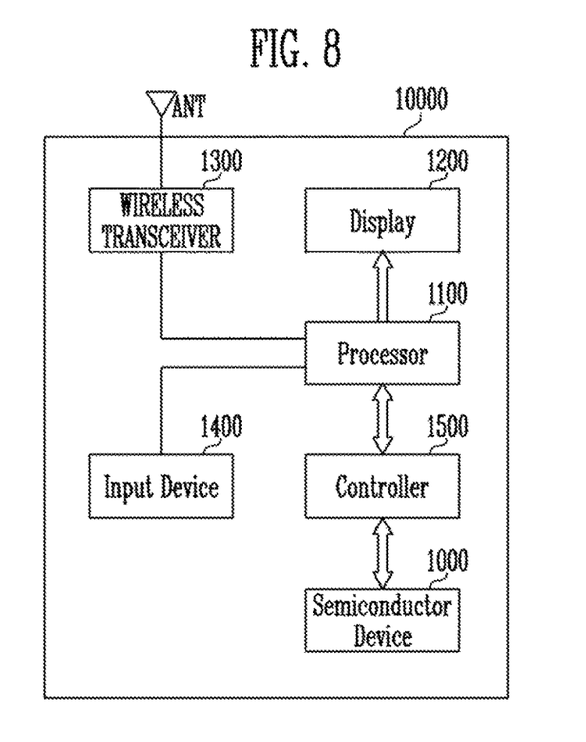
FIG. 8 is a block diagram illustrating an embodiment of a semiconductor system including the semiconductor device shown in FIG. 7.

FIG. 8 is a block diagram illustrating an embodiment of a semiconductor system 10000 including a semiconductor device 1000 shown in FIG. 7.

Referring to FIG. 8, an embodiment in which the semiconductor device 1000 shown in FIG. 7 is included in the semiconductor system 10000 is shown. The semiconductor system 10000 may be embodied as a cellular phone, a smart phone, a tablet PC, a personal digital assistant (PDA), or a wireless communication device. The semiconductor system 10000 may include the semiconductor device 1000, a processor 1100, a display 1200, a wireless transceiver 1300, an input device 1400 and a controller 1500 for controlling operations of the semiconductor device 1000. The controller 1500 may control a data access operation of the semiconductor device 1000, e.g., a program operation, an erase operation or a read operation under the control of the processor 1100.

The controller 1500 may control data programmed by the semiconductor device 1000 to be displayed on the display 1200.

The wireless transceiver 1300 may transmit or receive a wireless signal through an antenna ANT. For example, the wireless transceiver 1300 may change the wireless signal received through the antenna ANT into a signal which can be processed by the processor 1100. Therefore, the processor 1100 may process the signal received from the wireless transceiver 1300 and transfer the processed signal to the controller 1500 or the display 1200. The controller 1500 may program the signal processed by the processor 1100 into the semiconductor device 1000. In addition, the wireless transceiver 1300 may change the signal received from the processor 1100 into a wireless signal and output the changed wireless signal to an external device through the antenna ANT. A control signal for controlling operations of the processor 1100, or data to be processed by the processor 1100 may be inputted through the input device 1400. The input device 1400 may be embodied as at least one of a pointing device, such as a touch pad and a computer mouse, a keypad and a keyboard. The processor 1100 may control operations of the display 1200 so that at least one of the data received from the controller 1500, the data received from the wireless transceiver 1300, and the data received from the input device 1400 may be displayed on the display 1200.

According to an embodiment, the controller 1500 designed to control the operations of the semiconductor device 1000 may be formed as a part of the processor 1100. In another embodiment, the controller 1500 may be formed as a separate chip from the processor 1100.

Figure 9:
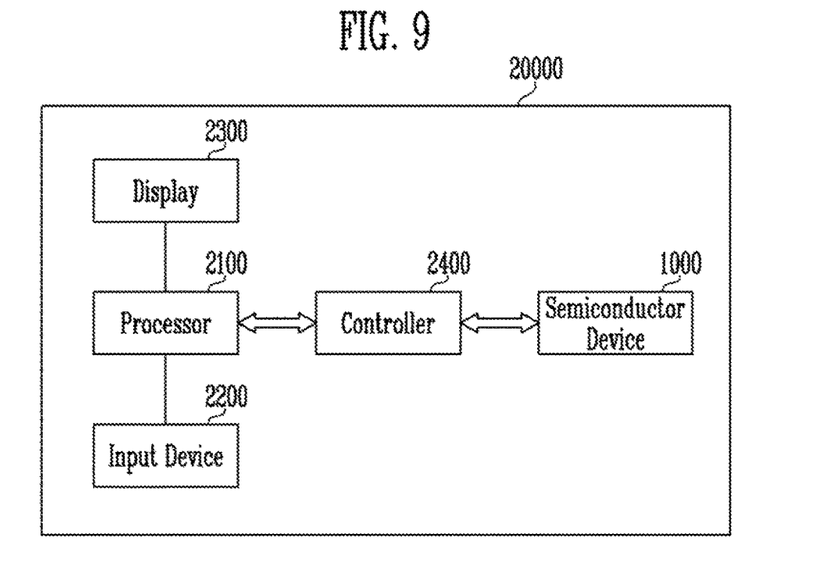
FIG. 9 is a block diagram illustrating another embodiment of a semiconductor system including the semiconductor device shown in FIG. 7.

FIG. 9 is a block diagram illustrating another embodiment of a semiconductor system 20000 including the semiconductor device 1000 shown in FIG. 7.

Referring to FIG. 9, the semiconductor system 20000 may be embodied as a personal computer (PC), a tablet PC, a net-book, an e-reader, a personal digital assistant (PDA), a portable multimedia player (PMP), an MP3 player, or an MP4 player.

The semiconductor system 20000 may include the semiconductor device 1000, a processor 2100, an input device 2200, a display 2300 and a controller 2400 controlling a data processing operation of the semiconductor device 1000.

The processor 2100 may display the data stored in the semiconductor device 1000 in response to the data received through the input device 2200 on the display 2300. For example, the input device 2200 may be embodied as at least one of a pointing device, such as a touch pad or a computer mouse, a keypad, and a keyboard.

The processor 2100 may control the general operations of the semiconductor system 20000 and operations of the controller 2400. According to an embodiment, the controller 2400 for controlling the operations of the semiconductor device 1000 may be formed as a part of the processor 2100. In another embodiment, the controller 2400 may be formed as a separate chip from the processor 2100.

Figure 10:
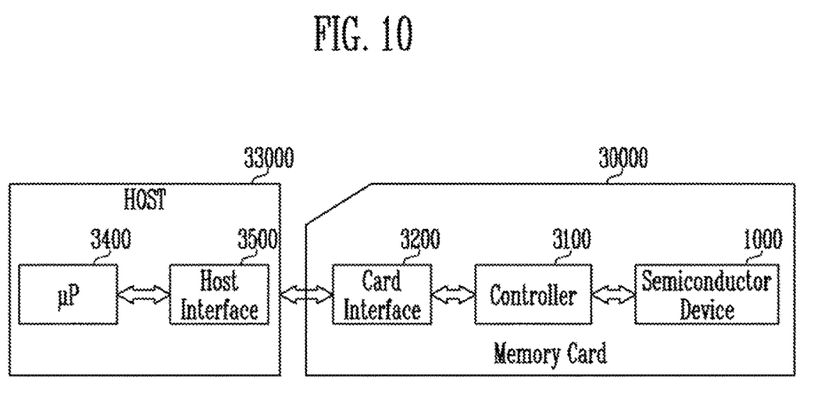
FIG. 10 is a block diagram illustrating another embodiment of a semiconductor system including the semiconductor device shown in FIG. 7.

FIG. 10 is a block diagram illustrating a semiconductor system 30000 including the semiconductor device 1000 shown in FIG. 7, according to an embodiment of the present invention.

Referring to FIG. 10, the semiconductor system 30000 may be embodied as a memory card or a smart card. The semiconductor system 30000 may include the semiconductor device 1000, a controller 3100, and a card interface 3200.

The controller 3100 may control data exchange between the semiconductor device 1000 and the card interface 3200. According to an embodiment, the card interface 3200 may be, but not limited thereto, a secure digital (SD) card interface or a multi-media card (MMC) interface.

The card interface 3200 may interface data exchange between the host 33000 and the controller 3100 according to a protocol of the host 33000. According to an embodiment, the card interface 3200 may support a Universal Serial Bus (USB) protocol and an InterChip (IC)-USB protocol. The card interface 3200 may refer to hardware supporting the protocol used by the host 33000, software mounted onto the hardware, or a signal transmission method.

When the semiconductor system 30000 is coupled to a host interface 3500 of the host 33000, such as a PC, a tablet PC, a digital camera, a digital audio player, a mobile phone, console video game hardware, or a digital set-top box, a microprocessor (µP) 3400 may control the host interface 3500 to perform data communication with the semiconductor device 1000 through the card interface 3200 and the controller 3100.

Figure 11:
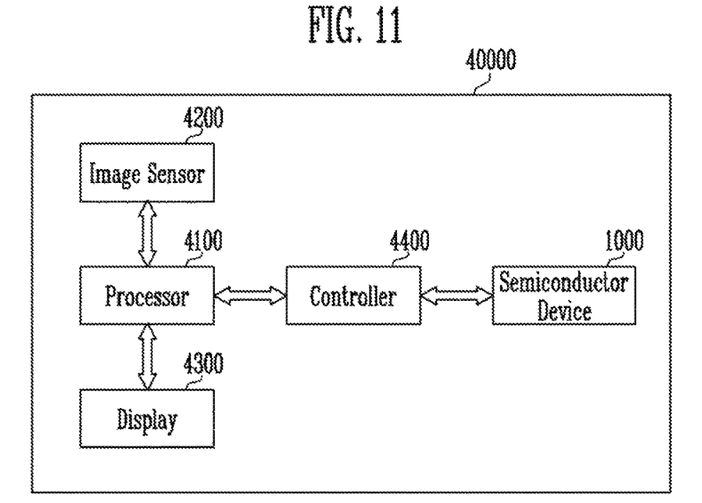
FIG. 11 is a block diagram illustrating another embodiment of a semiconductor system including a semiconductor device shown in FIG. 7.

FIG. 11 is a block diagram illustrating a semiconductor system 40000 including the semiconductor device 1000 shown in FIG. 7, according to an embodiment of the present invention.

Referring to FIG. 11, the semiconductor system 40000 may be embodied as an image processor, for example, a digital camera, a mobile phone provided with a camera, or a tablet PC provided with a digital camera.

The semiconductor system 40000 may include the semiconductor device 1000, a processor 4100, an image sensor 4200, a display 4300 and a controller 4400 for controlling a data processing operation of the semiconductor device 1000, for example, at least one of a program operation, an erase operation and a read operation.

The image sensor 4200 of the semiconductor system 40000 may convert an optical image into digital signals, and the converted digital signals may be transmitted to the processor 4100. The processor 4100 may control the converted digital signals to be displayed on the display 4300 or to be stored in the semiconductor device 1000 through the controller 4400. In addition, the processor 4100 or the controller 4400 may control the data stored in the semiconductor device 1000 to be displayed on the display 4300.

According to an embodiment, the controller 4400 controlling the operations of the semiconductor device 1000 may be formed as a part of the processor 4100. In another embodiment, the controller 4400 may be formed as a separate chip from the processor 4100.

Figure 12:
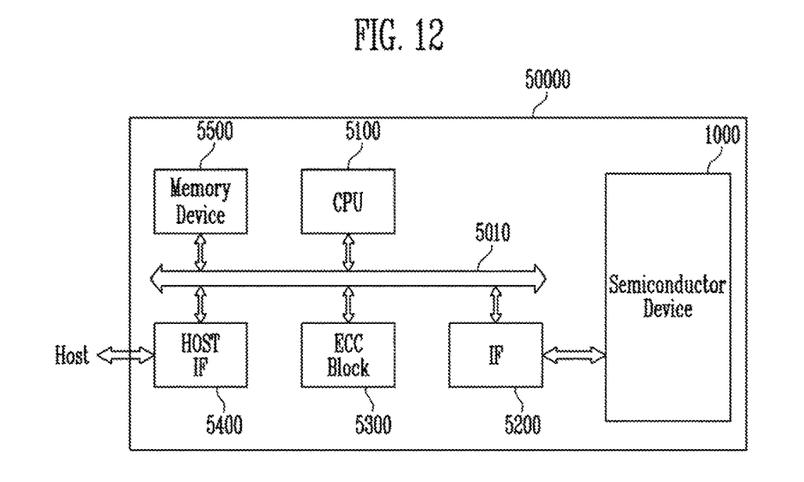
FIG. 12 is a block diagram illustrating another embodiment of a semiconductor system including a semiconductor device shown in FIG. 7.

FIG. 12 is a block diagram illustrating another embodiment of a semiconductor system 50000 including the semiconductor device 1000 shown in FIG. 7.

Referring to FIG. 12, the semiconductor system 50000 may include the semiconductor device 1000 and a central processing unit (CPU) 5100 capable of controlling the operations of the semiconductor device 1000. Further, the semiconductor system 50000 may include interface 5200, an error correction code (ECC) block 5300, a host interface 5400 and a memory device 5500 operatively coupled to the CPU via an internal bus 5010.

The memory device 5500 that may be used as an operation memory of the CPU 5100. The memory device 5500 may include a non-volatile memory, such as a read only memory (ROM), or a volatile memory, such as a static random access memory (SRAM).

A host HOST may be operatively coupled to the semiconductor system 50000. The host HOST may perform data communication with the semiconductor device 1000 through the interface 5200 and the host interface 5400. The CPU 5100 may control the ECC block 5300 to detect an error bit included in the data received from the semiconductor device 1000 through the interface 5200 and transmit the error-corrected data to the host HOST through the host interface 5400.

The CPU 5100 may control data communication between the interface 5200, the ECC block 5300, the host interface 5400 and the memory device 5500 through the bus 5010.

The semiconductor system 50000 may be embodied as a flash memory drive, a USB memory drive, an IC-USB memory driver, or a memory stick.

Figure 13:
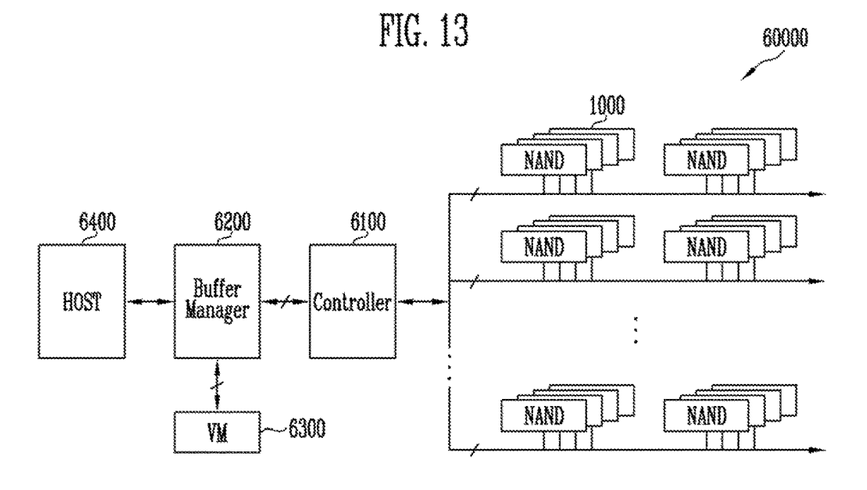
FIG. 13 is a block diagram illustrating another embodiment of a semiconductor system including a semiconductor device shown in FIG. 7.

FIG. 13 is a block diagram illustrating another embodiment of a semiconductor system 60000 including a semiconductor device 1000 shown in FIG. 7.

Referring to FIG. 13, the semiconductor system 60000 may be embodied as a data processing device such as a solid state drive (SSD).

The semiconductor system 60000 may include a plurality of semiconductor devices 1000, a controller 6100 capable of controlling data processing operations of the respective semiconductor devices 1000, a volatile memory (VM) device 6300, such as a dynamic random access memory (DRAM), and a buffer manager 6200 storing data exchanged between the controller 6100 and a host 6400 in the volatile memory device 6300.

According to an embodiment, since power supplied to an internal circuit included in a semiconductor device may be stably blocked in a standby mode, power consumption of the semiconductor device may be reduced.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A current break circuit, comprising:
    a current break control circuit suitable for sequentially outputting a first enable signal and a second enable signal with a time difference in response to at least one control signal, wherein the second enable signal has a same level as the first enable signal; and
    a current break switch circuit suitable for outputting or blocking a second voltage in response to a first voltage, wherein the current break switch circuit forms a first current path in response to the first enable signal and a second current path in response to the second enable signal when blocking the second voltage.

2. The current break circuit of claim 1, wherein the current break control circuit comprises:
    a first enable signal output circuit for outputting the first enable signal in response to the at least one control signal; and a delay circuit for outputting the second enable signal after a predetermined time delay from when the first enable signal is applied.

3. The current break circuit of claim 2, wherein the first enable signal output circuit comprises a NAND gate for outputting the first enable signal in response to the at least one control signal.

4. The current break circuit of claim 3, wherein the at least one control signal includes an active mode signal, a power on reset signal and a chip enable signal.

5. The current break circuit of claim 4, wherein the first enable signal output circuit further comprises:
a first inverter for inverting and outputting the active mode signal; and
a second inverter for inverting and outputting the power on reset signal.

6. The current break circuit of claim 4, wherein the delay circuit includes a plurality of inverters for delaying the first enable signal and outputting a delayed first enable signal as the second enable signal.

7. The current break circuit of claim 6, wherein a number of inverters is determined in consideration of time when a glitch occurs in a node through which the second voltage is output.

8. The current break circuit of claim 1, wherein the current break switch circuit comprises first and second current break units and first and second enable units coupled between a power source terminal and a ground terminal.

9. The current break circuit of claim 8, wherein the first and second current break units are alternately arranged and coupled in parallel with the power source terminal, and
the first and second enable units are alternately arranged and coupled between the first and second current break units and the ground terminal.

10. The current break circuit of claim 9, wherein the first and second current break units are coupled in series,
the first voltage is applied to a foremost current break unit, among the first and second current break units, and
the second voltage is output to a hindmost current break unit, among the first and second current break units.

11. The current break circuit of claim 10, wherein each of the first and second current break units includes an inverter.

12. The current break circuit of claim 9, wherein the first enable units are activated in response to the first enable signal, and
the second enable units are activated in response to the second enable signal.

13. The current break circuit of claim 12, wherein the first enable units include NMOS transistors forming a current path between the first current break units and the ground terminal in response to the first enable signal, and
the second enable units include NMOS transistors forming a current path between the second current break units and the ground terminal in response to the second enable signal.

14. A semiconductor device, comprising:
a power gating circuit suitable for receiving a first voltage, outputting the first voltage as a second voltage in an active mode, and blocking the second voltage by forming a current path with a predetermined time difference in a circuit outputting the second voltage in a standby mode; and
an internal circuit suitable for operating at the second voltage as power in the active mode.

15. The semiconductor device of claim 14, wherein the power gating circuit comprises even current break units and odd current break units for receiving the first voltage and outputting the second voltage, and
a current break circuit including even enable units and odd enable units forming a first current path between the even current break units and a ground terminal and, after a delay of the predetermined time difference, forming a second current path between the odd current break units and the ground terminal when the active mode is switched to the standby mode.

16. The semiconductor device of claim 15, wherein the even current break units and the even enable units are coupled in series between a power source terminal and the ground terminal, and
the odd current break units and the odd enable units are coupled in series between the power source terminal and the ground terminal.

17. The semiconductor device of claim 16, wherein the even current break units and the odd current break units are alternately arranged, and
the even enable units and the odd enable units are alternately arranged.

18. The semiconductor device of claim 17, wherein the even enable units form the first current path between the even current break units and the ground terminal in response to an even enable signal, and
the odd enable units form the second current path between the odd current break units and the ground terminal in response to an odd enable signal.

19. A method of operating a current break circuit, the method comprising:
coupling first current break units to a ground terminal, among the first current break units and second current break units receiving a first voltage and outputting a second voltage, when an active mode is switched to a standby mode;
coupling the second current break units to the ground terminal with a predetermined time difference after coupling the first current break units to the ground terminal; and
blocking an output of the second voltage.

20. The method of claim 19, further comprising:
outputting a first enable signal to couple the first current break units to the ground terminal; and
outputting a second enable signal after a delay of a predetermined time after the first enable signal is output to couple the second current break units to the ground terminal.

* * * * *